(12) United States Patent
Kirby (10) Patent No.: US 7,253,397 B2
(45) Date of Patent: Aug. 7, 2007

(54) PACKAGED MICROELECTRONIC IMAGERS AND METHODS OF PACKAGING MICROELECTRONIC IMAGERS

(75) Inventor: Kyle K. Kirby, Boise, ID (US)

(73) Assignee: Micron Technology, Inc., Boise, ID (US)

(*) Notice: Subject to any disclaimer, the term of this patent is extended or adjusted under 35 U.S.C. 154(b) by 85 days.

(21) Appl. No.: 10/785,466

(22) Filed: Feb. 23, 2004

(65) Prior Publication Data

US 2005/0184219 A1    Aug. 25, 2005

(51) Int. Cl.
*H01J 5/02* (2006.01)
*H01L 31/0203* (2006.01)

(52) U.S. Cl. .................... 250/239; 257/433

(58) Field of Classification Search ............ 250/239; 257/433, 434; 438/64, 65; 275/433, 434
See application file for complete search history.

(56) References Cited

U.S. PATENT DOCUMENTS

| | | | |
|---|---|---|---|
| 3,345,134 A | 10/1967 | Heymer et al. | |
| 4,534,100 A | 8/1985 | Lane | |
| 4,906,314 A | 3/1990 | Farnworth et al. | |
| 5,130,783 A | 7/1992 | McLellan | |
| 5,371,397 A | 12/1994 | Maegawa et al. | |
| 5,424,573 A | 6/1995 | Kato et al. | |
| 5,435,887 A | 7/1995 | Rothschild et al. | |
| 5,505,804 A | 4/1996 | Mizuguchi et al. | |
| 5,593,913 A | 1/1997 | Aoki | |
| 5,605,783 A | 2/1997 | Revelli et al. | |
| 5,672,519 A | 9/1997 | Song et al. | |
| 5,694,246 A | 12/1997 | Aoyama et al. | |
| 5,708,293 A | 1/1998 | Ochi et al. | |
| 5,753,857 A * | 5/1998 | Choi ................ | 174/52.4 |
| 5,771,158 A | 6/1998 | Yamagishi et al. | |
| 5,776,824 A | 7/1998 | Farnworth et al. | |

(Continued)

FOREIGN PATENT DOCUMENTS

EP    0 886 323    12/1998

(Continued)

OTHER PUBLICATIONS

U.S. Appl. No. 10/845,304, Jiang et al.

(Continued)

*Primary Examiner*—Thanh X. Luu
*Assistant Examiner*—Brian Livedalen
(74) *Attorney, Agent, or Firm*—Dickstein Shapiro LLP (57) ABSTRACT

Microelectronic imagers and methods of packaging microelectronic imagers are disclosed herein. In one embodiment, a microelectronic imager can include a microelectronic die, an image sensor, an integrated circuit electrically coupled to the image sensor, and a plurality of terminals electrically coupled to the integrated circuit. The microelectronic imager can further include a single unitary member cover unit having a window and a side member projecting from the window. The side member is attached to the die. A plurality of electrically conductive interconnects can extend through the microelectronic die and/or the cover unit and are electrically coupled to corresponding terminals. The microelectronic imager can further include an optics unit having an optic member attached to the cover unit, with the optic member positioned at a desired location relative to the image sensor.

47 Claims, 6 Drawing Sheets

U.S. PATENT DOCUMENTS

| | | |
|---|---|---|
| 5,811,799 A | 9/1998 | Wu |
| 5,821,532 A | 10/1998 | Beaman et al. |
| 5,857,963 A | 1/1999 | Pelchy et al. |
| 5,861,654 A | 1/1999 | Johnson |
| 5,877,040 A | 3/1999 | Park et al. |
| 5,897,338 A | 4/1999 | Kaldenberg |
| 5,914,488 A | 6/1999 | Sone |
| 5,932,875 A * | 8/1999 | Chung et al. ............. 250/239 |
| 5,977,535 A | 11/1999 | Rostoker |
| 5,998,862 A | 12/1999 | Yamanaka |
| 6,080,291 A | 6/2000 | Woodruff et al. |
| 6,104,086 A | 8/2000 | Ichikawa et al. |
| 6,114,240 A | 9/2000 | Akram et al. |
| 6,143,588 A * | 11/2000 | Glenn ........................ 438/116 |
| 6,236,046 B1 | 5/2001 | Watabe et al. |
| 6,259,083 B1 | 7/2001 | Kimura |
| 6,266,197 B1 | 7/2001 | Glenn et al. |
| 6,274,927 B1 | 8/2001 | Glenn |
| 6,285,064 B1 | 9/2001 | Foster |
| 6,351,027 B1 | 2/2002 | Giboney et al. |
| 6,372,548 B2 | 4/2002 | Bessho et al. |
| 6,407,381 B1 | 6/2002 | Glenn et al. |
| 6,411,439 B2 | 6/2002 | Nishikawa |
| 6,483,652 B2 | 11/2002 | Nakamura |
| 6,503,780 B1 * | 1/2003 | Glenn et al. ............... 438/116 |
| 6,541,762 B2 * | 4/2003 | Kang et al. ............... 250/239 |
| 6,560,047 B2 | 5/2003 | Choi et al. |
| 6,566,745 B1 | 5/2003 | Beyne et al. |
| 6,603,183 B1 | 8/2003 | Hoffman |
| 6,617,623 B2 | 9/2003 | Rhodes |
| 6,661,047 B2 | 12/2003 | Rhodes |
| 6,667,551 B2 | 12/2003 | Hanaoka et al. |
| 6,670,986 B1 | 12/2003 | Ben Shoshan et al. |
| 6,686,588 B1 | 2/2004 | Webster et al. |
| 6,703,310 B2 | 3/2004 | Mashino et al. |
| 6,864,172 B2 | 4/2004 | Noma et al. |
| 6,734,419 B1 * | 5/2004 | Glenn et al. ............... 250/239 |
| 6,759,266 B1 * | 7/2004 | Hoffman ..................... 438/64 |
| 6,762,472 B2 * | 7/2004 | Loh et al. .................. 257/432 |
| 6,774,486 B2 | 8/2004 | Kinsman |
| 6,778,046 B2 | 8/2004 | Stafford et al. |
| 6,791,076 B2 | 9/2004 | Webster |
| 6,795,120 B2 | 9/2004 | Takagi et al. |
| 6,797,616 B2 | 9/2004 | Kinsman |
| 6,800,943 B2 | 10/2004 | Adachi |
| 6,813,154 B2 | 11/2004 | Diaz et al. |
| 6,825,458 B1 * | 11/2004 | Moess et al. ............... 250/239 |
| 6,828,663 B2 | 12/2004 | Chen et al. |
| 6,828,674 B2 | 12/2004 | Karpman |
| 6,844,978 B2 | 1/2005 | Harden et al. |
| 6,882,021 B2 | 4/2005 | Boon et al. |
| 6,885,107 B2 | 4/2005 | Kinsman |
| 6,934,065 B2 | 8/2005 | Kinsman |
| 6,946,325 B2 | 9/2005 | Yean et al. |
| 2002/0006687 A1 | 1/2002 | Lam |
| 2002/0057468 A1 * | 5/2002 | Segawa et al. ............. 358/509 |
| 2002/0089025 A1 | 7/2002 | Chou |
| 2002/0096729 A1 | 7/2002 | Tu et al. |
| 2002/0113296 A1 | 8/2002 | Cho et al. |
| 2002/0145676 A1 | 10/2002 | Kuno et al. |
| 2003/0062601 A1 | 4/2003 | Harnden et al. |
| 2004/0012698 A1 | 1/2004 | Suda et al. |
| 2004/0023469 A1 | 2/2004 | Suda |
| 2004/0038442 A1 | 2/2004 | Kinsman |
| 2004/0041261 A1 | 3/2004 | Kinsman |
| 2004/0082094 A1 | 4/2004 | Yamamoto |
| 2004/0214373 A1 | 10/2004 | Jiang et al. |
| 2004/0245649 A1 | 12/2004 | Imaoka |
| 2005/0052751 A1 | 3/2005 | Liu et al. |
| 2005/0104228 A1 | 5/2005 | Rigg et al. |
| 2005/0110889 A1 | 5/2005 | Tuttle et al. |
| 2005/0127478 A1 | 6/2005 | Hiatt et al. |
| 2005/0151228 A1 | 7/2005 | Tanida et al. |
| 2005/0236708 A1 | 10/2005 | Farnworth et al. |
| 2005/0254133 A1 | 11/2005 | Akram et al. |

FOREIGN PATENT DOCUMENTS

| | | |
|---|---|---|
| EP | 1 157 967 A2 | 11/2001 |
| FR | 2 835 654 A1 | 8/2003 |
| JP | 59-101882 A | 6/1984 |
| JP | 59191388 | 10/1984 |
| JP | 07-263607 A | 10/1995 |
| JP | 2001-077496 A | 3/2001 |
| WO | WO-90/05424 A1 | 5/1990 |
| WO | WO-02/075815 A1 | 9/2002 |
| WO | WO-02/095796 A2 | 11/2002 |
| WO | WO-2004/054001 A2 | 6/2004 |

OTHER PUBLICATIONS

U.S. Appl. No. 10/857;948, Boettiger et al.
U.S. Appl. No. 10/863,994, Akram et al.
U.S. Appl. No. 10/864,974, Kirby et al.
U.S. Appl. No. 10/867,352, Farnworth et al.
U.S. Appl. No. 10/867,505, Farnworth et al.
U.S. Appl. No. 10/879,398, Akram et al.
U.S. Appl. No. 10/879,838, Kirby et al.
U.S. Appl. No. 10/893,022, Hall et al.
U.S. Appl. No. 10/894,262, Farnworth et al.
U.S. Appl. No. 10/901,851, Derderian et al.
U.S. Appl. No. 10/910,491, Bolken et al.
U.S. Appl. No. 10/915,180, Street et al.
U.S. Appl. No. 10/919,604, Farnworth et al.
U.S. Appl. No. 10/922,177, Oliver et al.
U.S. Appl. No. 10/922,192, Farnworth.
U.S. Appl. No. 10/925,406, Oliver.
U.S. Appl. No. 10/925,501, Oliver.
U.S. Appl. No. 10/925,502, Watkins et al.
U.S. Appl. No. 10/927,550, Derderian et al.
U.S. Appl. No. 10/927,760, Chong et al.
U.S. Appl. No. 10/928,598, Kirby.
U.S. Appl. No. 10/932,296, Oliver et al.
U.S. Appl. No. 11/027,443, Kirby.
U.S. Appl. No. 11/054,692, Boemler.
U.S. Appl. No. 11/056,211, Hembree et al.
U.S. Appl. No. 11/056,484, Boettiger et al.
U.S. Appl. No. 11/061,034, Boettiger.
U.S. Appl. No. 11/146,783, Tuttle et al.
U.S. Appl. No. 11/169,546, Sulfridge.
U.S. Appl. No. 11/169,838, Sulfridge.
U.S. Appl. No. 11/177,905, Akram.
U.S. Appl. No. 11/209,524, Akram.
U.S. Appl. No. 11/217,169, Hiatt et al.
U.S. Appl. No. 11/217,877, Oliver et al.
U.S. Appl. No. 11/218,126, Farnworth et al.
U.S. Appl. No. 11/218,243, Kirby et al.
Aachboun, S. and P. Ranson, "Cryogenic etching of deep narrow trenches in silicon," J. Vac. Sci. Technol. A 18(4), Jul./Aug. 2000, pp. 1848-1852.
Aachboun, S. and P. Ranson, "Deep anisotropic etching of silicon," J. Vac. Sci. Technol. A 17(4), Jul./Aug. 1999, pp. 2270-2273.
Austin, M.D. and S.Y. Chou, "Fabrication of 70 nm channel length polymer organic thin-film transistors using nanoimprint lithography," Applied Physics Letters, vol. 81, No. 23, pp. 4431-4433, Dec. 2, 2002, American Institute of Physics.
Blackburn, J.M. et al., "Deposition of Conformal Copper and Nickel Films from Supercritical Carbon Dioxide," Science, vol. 294, pp. 141-145, Oct. 5, 2001.
Brubaker, C. et al., "Ultra-thick Lithography for Advanced Packaging and MEMS," SPIE's 27th Annual International Symposium on Microlithography 2002, Mar. 3-8, 2002, Santa Clara, CA.

Cheng, Yu-T. et al., "Vacuum Packaging Technology Using Localized Aluminum/Silicon-to-Glass Bonding," Journal of Microelectromechanical Systems, vol. 11, No. 5, pp. 556-565, Oct. 2002.

DuPont Electronic Materials, Data Sheet, Pyralux PC 2000 Flexible Composites, 4 pages, Oct. 1998, <http://www.dupont.com/fcm>.

Edmund Industrial Optics, Mounted IR Filters, 1 page, retrieved from the Internet on Jun. 30, 2003, <http://www.edmundoptics.com>.

Hamdorf, M. et al., "Surface-rheological measurements on glass forming polymers based on the surface tension driven decay of imprinted corrugation gratings," Journal of Chemical Physics, vol. 112, No. 9, pp. 4262-4270, Mar. 1, 2000, American Institute of Physics.

Hirafune, S. et al., "Packaging Technology for Imager Using Through-hole Interconnection in Si Substrate," Proceeding of HDP'04, IEEE, pp. 303-306, Jul. 2004.

IBM, Zurich Researech Laboratory, EPON SU-8 photoresist, 1 page, retrieved from the Internet on Jan. 21, 2003, <http://www.zurich.ibm.com/st.mems/su8.html>.

Intrinsic Viscosity and Its Relation to Intrinsic Conductivity, 9 pages, retrieved from the Internet on Oct. 30, 2003, <http://www.ciks.cbt.nist.gov/~garbocz/paper58/node3.html>.

King, B. et al., Optomec, Inc., M3D™ Technology, Maskless Mesoscale™ Materials Deposition, 5 pages, <http://www.optomec.com/downloads/M3D%20White%Paper%20080502.pdf>, retrieved from the Internet on Jun. 17, 2005.

Kingpak Technology, Inc. "CMOS Image Sensor Packaging," 1 page, retrieved from the Internet on Aug. 26, 2003, <http://www.kingpak.com/CMOSImager.html>.

Kramer, S.J. et al., "Annual Report—Applications of Supercritical Fluid Technology to Semiconductor Device Processing," pp. 1-29, Nov. 2001.

Kyocera Corporation, Memory Package, 1 page, retrieved from the Internet on Dec. 3, 2004, <http://global.kyocera.com/prdct/semicon/ic_pkg/memory_p.html>.

Lin, Tim (Zhigang) and Rick Yoon, " One Package Technique of Exposed MEMS Sensors," pp. 105-108, 2002 International Symposium on Microelectronics, Sep. 2002.

Ma, X. et al., "Low Temperature Bonding for Wafer Scale Packaging and Assembly of Micromachined Sensors," Final Report 1998-1999 for MICRO Project 98-144, 3 pages, Department of Electrical & Computer Engineering, University of California, Davis.

Micro Chem, Nano SU-8, Negative Tone Photoresist Formulations 50-100, 4 pages, Feb. 2002, <http://www.microchem.com/products/pdf/SU8_50-100.pdf>.

Optomec, Inc., M3D™ Technology, Maskless Mesoscale Materials Deposition (M3D), 1 page, <http://www.optomec.com/html/m3d.htm>, retrieved from the Internet on Aug. 15, 2003.

Optomec, Inc., M3D™, Maskless Mesoscale™ Materials Deposition, 2 pages, <http://www.optomec.com/downloads/M3DSheet.pdf>, retrieved from the Internet on Jun. 17, 2005.

Photo Vision Systems, Inc., "Advances in Digital Image Sensors," 22 pages, First Annual New York State Conference on Microelectronic Design, Jan. 12, 2002.

Shen, X.-J. et al., "Microplastic embossing process: experimental and theoretical characterizations," Sensors and Actuators, A 97-98 (2002) pp. 428-433, Elsevier Science B.V.

Tapes II International Tape and Fabrication Company, Electronics and Electrical Tapes, 2 pages, 2003, <http://www.tapes2.com/electronics.htm>.

TransChip, 1 page, retrieved from the Internet on Aug. 26, 2003, <http://www.missionventures.com/portfolio/companies/transchip.html>.

TransChip, Inc., CMOS vs CCD, 3 pages, retrieved from the Internet on Dec. 14, 2005, <http://www.transchip.com/content.aspx?id=127>.

TransChip, Inc. Technology, 3 pages, retrieved from the Internet on Dec. 14, 2005, <http://www.transchip.com/content.aspx?id=10>.

UCI Integrated Nanosystems Research Facility, "Cleaning procedures for glass substrates," 3 pages, Fall 1999.

UCI Integrated Nanosystems Research Facility, "Glass Etch Wet Process," 3 pages, Summer 2000.

Walker, M.J., "Comparison of Bosch and cryogenic processes for patterning high aspect ratio features in silicon," 11 pages, Proc. SPIE vol. 4407, p. 88-99, MEMS Design, Fabrication, Characterization, and Packaging, Uwe F. Behringer; Deepak G. Uttamchandani; Eds., Apr. 2001.

Xsil, Via Applications, 1 page, <http://www.xsil.com/viaaplications/index.htm>, retrieved from the Internet on Jul. 22, 2003.

Xsil, Vias for 3D Packaging, 1 page, <http://www.xsil.com/viaapplications/3dpackaging/index.htm>, retrieved from the Internet on Jul. 22, 2003.

Ye, X.R. et al., "Immersion Deposition of Metal Films on Silicon and Germanium Substrates in Supercritical Carbon Dioxide," Chem. Mater. 2003, 15, 83-91.

Yoshida, J. "TransChip rolls out a single-chip CMOS imager," 3 pages, EE Times, Jul. 18, 2003.

* cited by examiner

PACKAGED MICROELECTRONIC IMAGERS AND METHODS OF PACKAGING MICROELECTRONIC IMAGERS

TECHNICAL FIELD

The present invention is related to microelectronic devices and methods for packaging microelectronic devices. Several aspects of the present invention are directed toward packaging microelectronic imagers that are responsive to radiation in the visible light spectrum or radiation in other spectrums.

BACKGROUND

Microelectronic imagers are used in digital cameras, wireless devices with picture capabilities, and many other applications. Cell phones and Personal Digital Assistants (PDAs), for example, incorporate microelectronic imagers for capturing and sending pictures. The use of microelectronic imagers in electronic devices has been steadily increasing as imagers become smaller and produce higher quality images with increased pixel counts.

Microelectronic imagers include image sensors that use Charged Coupled Device (CCD) systems, Complementary Metal-Oxide Semiconductor (CMOS) systems, or other systems. CCD image sensors have been widely used in digital cameras and other applications. CMOS image sensors are also becoming very popular because they have low production costs, high yields, and small sizes. CMOS image sensors provide these advantages because they are manufactured using technology and equipment developed for fabricating semiconductor devices. CMOS image sensors, as well as CCD image sensors, are accordingly "packaged" to protect their delicate components and provide external electrical contacts.

Figure 1:
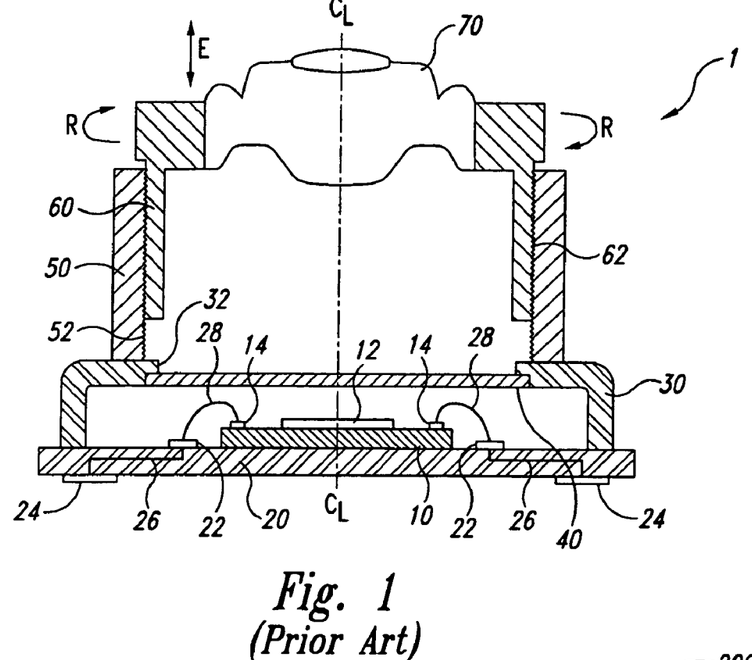
FIG. 1 is a schematic side cross-sectional view of a packaged microelectronic imager in accordance with the prior art.

FIG. 1 is a schematic view of a conventional microelectronic imager 1 with a conventional package. The imager 1 includes a die 10, an interposer substrate 20 attached to the die 10, and a housing 30 attached to the interposer substrate 20. The housing 30 surrounds the periphery of the die 10 and has an opening 32. The imager 1 also includes a transparent cover 40 over the die 10.

The die 10 includes an image sensor 12 and a plurality of bond-pads 14 electrically coupled to the image sensor 12. The interposer substrate 20 is typically a dielectric fixture having a plurality of bond-pads 22, a plurality of ball-pads 24, and traces 26 electrically coupling bond-pads 22 to corresponding ball-pads 24. The ball-pads 24 are arranged in an array for surface mounting the imager 1 to a board or module of another device. The bond-pads 14 on the die 10 are electrically coupled to the bond-pads 22 on the interposer substrate 20 by wire-bonds 28 to provide electrical pathways between the bond-pads 14 and the ball-pads 24.

The imager 1 shown in FIG. 1 also has an optics unit including a support 50 attached to the housing 30 and a barrel 60 adjustably attached to the support 50. The support 50 can include internal threads 52, and the barrel 60 can include external threads 62 engaged with the threads 52. The optics unit also includes a lens 70 carried by the barrel 60.

One problem with conventional packaged microelectronic imagers is that they have relatively large footprints and occupy a significant amount of vertical space (i.e., high profiles). For example, the footprint of the imager 1 in FIG. 1 is the surface area of the bottom of the interposer substrate 20, which is significantly larger than the surface area of the die 10. Accordingly, the footprint of conventional packaged microelectronic imagers can be a limiting factor in the design and marketability of picture cell phones or PDAs because these devices are continually shrinking to be more portable. Therefore, there is a need to provide microelectronic imagers with smaller footprints and lower vertical profiles.

Another problem with conventional microelectronic imagers is the manufacturing costs for packaging the dies. The housing 30 shown in FIG. 1 is relatively expensive to form and mount because the transparent cover 40 must be properly aligned and mounted in the opening 32 and then the housing 30 must be positioned and mounted to the interposer substrate 20. This process can be subject to error and is generally time-consuming. Moreover, forming the wire-bonds 28 on the imager 1 shown in FIG. 1 is complex and expensive because it requires connecting an individual wire between each bond-pad 14 on the die 10 and a corresponding interior pad 22 on the interposer substrate 20. In addition, it may not be feasible to form wire-bonds for the high-density, fine-pitch arrays of some high-performance devices. Therefore, there is a significant need to enhance the efficiency and reliability of packaging microelectronic imagers.

Yet another problem of the conventional imager 1 shown in FIG. 1 is that moisture and/or other contaminants can impair the performance of the imager 1. Even though the die 10 is packaged within a cell formed by interposer substrate 20, housing 30 and cover 40, moisture or other contaminants can get into the cell. For example, the seals of the substrate/housing and the housing/cover interfaces can fail because of faulty materials or assembly. The seals at these interfaces can also fail because the different coefficients of thermal expansion between the substrate 20, housing 30 and cover 40 induce strain at the interfaces that can break the seals. Moisture may also be stored in the substrate 20 and expelled into the cell at elevated temperatures. This is more likely with substrates formed from organic materials. Therefore, there is also a need to improve the integrity of the package to enhance the protection of the image sensor.

DETAILED DESCRIPTION

A. Overview

The following disclosure describes several embodiments of microelectronic imagers and methods of packaging microelectronic imagers. One particular embodiment of the invention is directed toward a microelectronic imaging unit comprising a microelectronic die, an integrated circuit, and an image sensor electrically coupled to the integrated circuit. The imaging die also includes a plurality of electrical terminals, such as bond-pads, electrically coupled to the integrated circuit. The imaging unit further includes a cover unit having a side member attached to the die. The cover unit includes a window carried by the side member such that the window is located at a desired location relative to the image sensor.

The cover unit can have several different configurations. In one embodiment, for example, the cover unit is a single unitary member that is attached to the die. The window and side member are accordingly integral with each other in such an embodiment. The cover unit, however, can be made of separate components in which the window is attached to the side member. The window and side member can accordingly be made from different materials in such embodiments. The cover unit can be pre-assembled before it is attached to the microelectronic die. The entire cover unit can be made of glass, quartz, or other materials transmissive to a desired spectrum of radiation. In embodiments directed toward imaging radiation in the visible spectrum, the cover unit can also filter infrared radiation or other undesirable spectrums of radiation.

In another aspect of the invention, an optics unit can be attached to the cover unit. The optics unit can include a stand-off or support member and an optic member carried by the support member. The support member can be attached to the cover unit and configured to position the optic member at a desired location relative to the image sensor. In other embodiments, the cover unit has an optic member in addition to or in lieu of having a separate optics unit.

Another aspect of the invention is directed to methods of packaging microelectronic imagers. One embodiment of such a method includes providing a microelectronic die having an image sensor, an integrated circuit electrically coupled to the image sensor, and a plurality of electrical terminals electrically coupled to the integrated circuit. The method further includes providing a cover unit having a side member and window carried by the side member. A plurality of electrically conductive interconnects aligned with corresponding bond-pads are formed through the microelectronic die and/or the cover unit. The method also includes attaching the cover unit to the die with the window positioned at a desired location relative to the image sensor. The method can also include attaching an optics unit having an optic member to the cover unit with the optic member positioned at a desired location relative to the image sensor.

Specific details of several embodiments of the invention are described below with reference to CMOS imagers to provide a thorough understanding of these embodiments, but other embodiments can be CCD imagers or other types of imaging devices. Several details describing well-known structures often associated with microelectronic devices are not set forth in the following description to avoid unnecessarily obscuring the description of the disclosed embodiments. Additionally, several other embodiments of the invention can have different configurations and/or components than those described in this section. As such, a person of ordinary skill in the art will accordingly understand that the invention may have other embodiments with additional elements or without several of the elements shown and described below with reference to FIGS. 2A-8.

B. Embodiments of Microelectronic Imagers

Figure 2A:
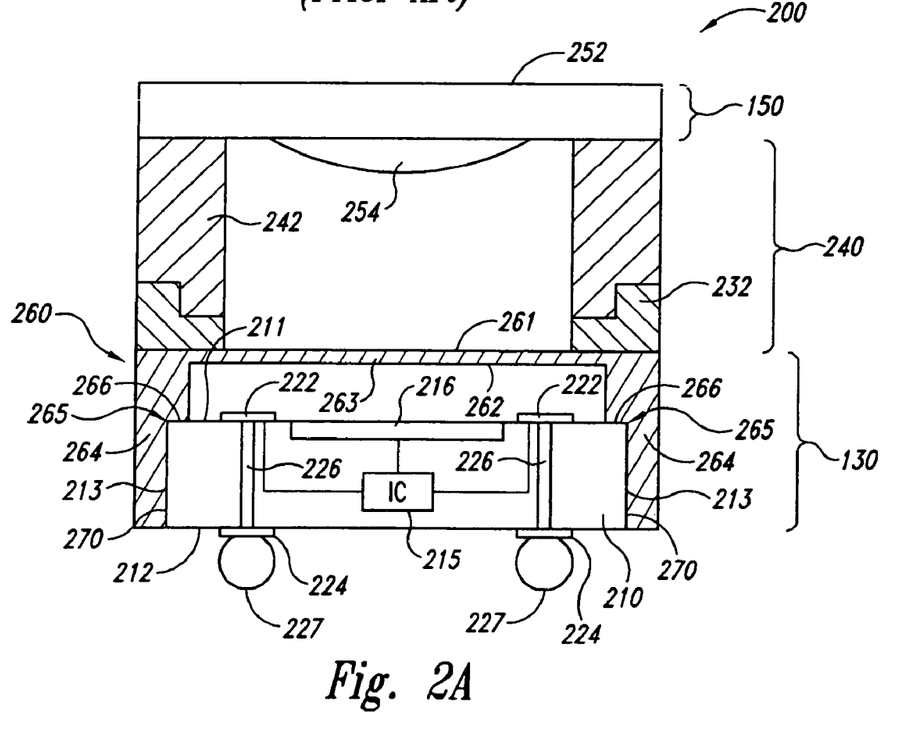
FIG. 2A is a schematic side cross-sectional view of a microelectronic imager in accordance with an embodiment of the invention.

FIG. 2A is a schematic side cross-sectional view of a microelectronic imager 200 in accordance with one embodiment of the invention. In the illustrated embodiment, the microelectronic imager 200 includes an imaging unit 130 and an optics unit 150. The embodiment of the imaging unit 150 shown in FIG. 2A includes a die 210 having a first side 211, a second side 212 opposite the first side 211, and a plurality of end surfaces 213 defining a perimeter of the die 210. The die 210 includes an integrated circuit 215 (shown schematically), an image sensor 216 operably coupled to the integrated circuit 215, and a plurality of terminals 222 (e.g., bond-pads) electrically coupled to the integrated circuit 215. The image sensor 216 can be a CMOS device or CCD for capturing pictures or other images in the visible spectrum. In other embodiments, the image sensor 216 can detect radiation and other spectrums (e.g., IR or UV ranges).

Figure 2B:
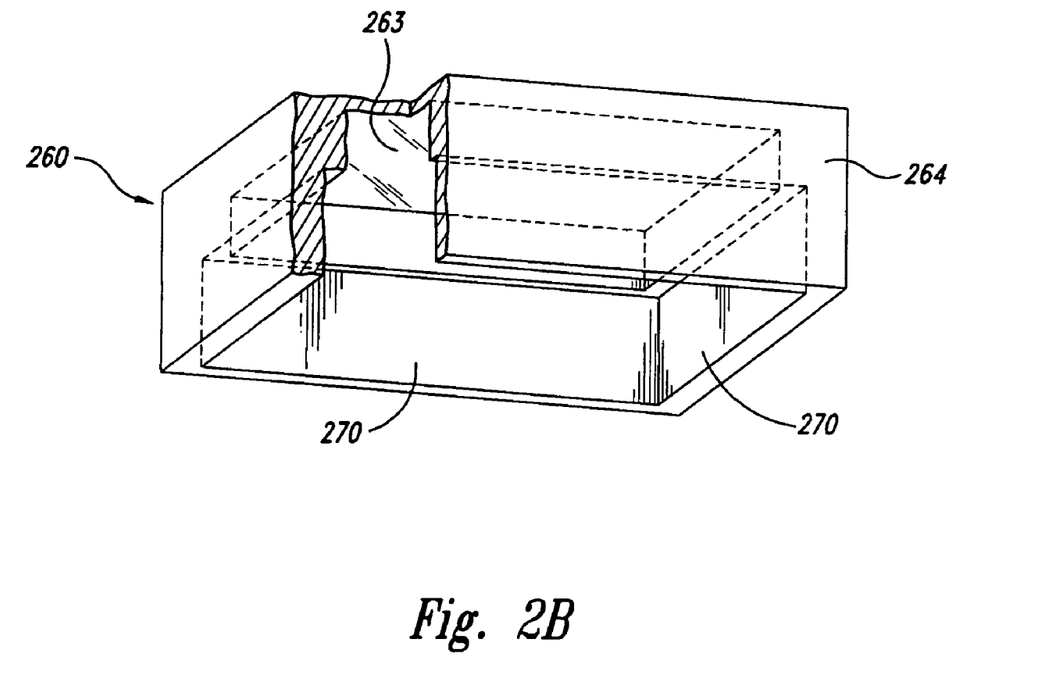
FIG. 2B is a bottom isometric view including a cut-out portion of a cover unit for use with the imager of FIG. 2A.

The microelectronic imager 200 can further include a cover unit 260. FIG. 2B is a partially schematic isometric view of the cover unit 260. Referring to FIGS. 2A and 2B together, the cover unit 260 includes a window 263 with a first side 261 facing generally away from the image sensor 216 and a second side 262 facing generally toward the image sensor 216. The cover unit 260 can be made of glass, quartz, or other materials transmissive to a desired spectrum of radiation. In embodiments directed toward imaging radiation in the visible spectrum, the cover unit 260 can also filter infrared radiation or other undesirable spectrums of radiation. The cover unit 260, for example, can be formed from a material and/or can have a coating that filters IR or near IR spectrums, and the cover unit 260 can have an anti-reflective (AR) coating. In some embodiments, a single coating can filter the desired spectrum and provide the desired anti-reflective properties.

The cover unit 260 can further include a side member 264. The side member 264 projects from the cover unit 260 and is configured to engage corresponding end surfaces 213 of the die 210. The side member 264 can further include a first interface feature 265 having a first stop component 266. The first stop component 266 provides a fixed surface at a known distance from the image sensor 216 for accurately positioning the cover unit 260, and more particularly the window 263, at a desired focus distance with respect to the image sensor 216. The first stop component 266 of the first interface feature 265 engages and mates with a corresponding portion of the die 210 to fixedly attach the cover unit 260 to the die 210. In this embodiment, the first interface feature 265 also includes a perimeter sidewall 270 that surrounds the end surfaces 213 defining the perimeter of the die 210. In some embodiments, an epoxy (not shown) can be used along the first stop component 266 and the sidewall 270 of the side member 264 to attach the cover unit 260 to the die 210. In other embodiments, other adhesive materials can be used to secure the cover unit 260 to the die 210 or, alternatively, no adhesive materials may be used. Additionally, the interface member 265 can include other types of features, or the side member 264 may not include an interface feature.

Referring back to FIG. 2A, this embodiment of the microelectronic imager 200 further includes a plurality of interconnects 226 having a first portion electrically coupled to corresponding bond-pads 222 and a second portion electrically coupled to a plurality of corresponding ball-pads 224. In the embodiment shown in FIG. 2A, the interconnects 226 are through-wafer interconnects that extend from the first side 211 to the second side 212 of the die 210 and contact corresponding bond-pads 222. Alternatively, other microelectronic imagers may not include through-wafer type interconnects 226. The interconnects 226 can be formed according to the processes disclosed in U.S. patent application Ser. No. 10/713,878, entitled "Microelectronic Devices, Methods for Forming Vias in Microelectronic Devices, and Methods for Packaging Microelectronic Devices," filed on Nov. 13, 2003 (Perkins Coie Docket No. 108298742US), which is incorporated by reference herein. The ball-pads 224 are formed in and/or on the second side 212 of the die 210 and are configured to receive solder balls 227 or other conductive elements. In other embodiments, the microelectronic imager 200 may not include the ball-pads 224 and/or the solder balls 227.

In the illustrated embodiment, the optics unit 150 of the microelectronic imager 200 is mounted to the cover unit 260. The optics unit 150 can include a plate 252 and an optic member 254 on the plate 252. The optic member 254 can be a lens for focusing the light, pinholes for reducing higher order refractions, and/or other optical structures for performing other functions.

The imager 200 further includes a stand-off or support member 240 between the imaging unit 130 and the optics unit 150. The embodiment of the support member 240 shown in FIG. 2A further includes a first referencing element 232 attached to the first side 261 of the cover unit 260 at a fixed position relative to the image sensor 216 and a second referencing element 242 that carries the plate 252 and the optic member 254. The support member 240 accurately situates the optic member 254 at a desired location with respect to the image sensor 216. Suitable support members 240 with additional interface features are disclosed in U.S. application Ser. No. 10/723,363, entitled "Packaged Microelectronic Imagers and Methods of Packaging Microelectronic Imagers," filed on Nov. 26, 2003 (Perkins Coie Docket No. 108298746US), which is herein incorporated by reference. The plate 252 is attached to the support member 240 in the embodiment shown in FIG. 2A, but other embodiments of the optics unit 150 may not include a plate such that the optic member 254 is attached directly to the support member 240.

The cover unit 260 shown in FIGS. 2A and 2B has several advantages compared to conventional imagers with separate housings, interposer substrates and dies. One advantage is that the cover unit 260 provides good protection for the die 210 because the cover unit 260 is a single, unitary component in which the window 263 and the side member 264 are integral with each other. The die 210 typically has six areas (e.g., sides) to seal and protect (i.e., the first side 211, the four end surfaces 213 defining the perimeter of the die 210, and the second side 212). The cover unit 260 inherently provides protection for five of the six sides (i.e., the first side 211 and the four end surfaces 213). Therefore, only a single seal is necessary along the second side 212 of the die 210. Another advantage of this feature is that the cover unit 260 is a more robust package and has fewer failure points. This feature helps prevent contamination or possible damage to the components of the die 210 during handling to enhance the protection of the die 210.

Another advantage of the cover unit 260 illustrated in FIGS. 2A and 2B is that there is no need for additional spacers or support members to support the cover unit 260 over the die 210. Accordingly, the manufacturing process can be more efficient because there is no need for additional steps or processes to construct spacer elements to the first side 211 of the die 210 or mount a separate housing to an interposer substrate. Further, the first interface features 265 on the cover unit 260 provide very precise control of the stand-off distance for the window 263 of the cover unit 260 with respect to the image sensor 216.

Another feature of the microelectronic imager 200 illustrated in FIG. 2A is that the microelectronic imager 200 can be much smaller than the conventional imager shown in FIG. 1. The footprint of the microelectronic imager 200 can be nearly as small as the size of the die 210 because the die is not mounted to a separate interposer substrate. This is possible because the interconnects 226 provide an electrical connection to an array of ball-pads 224 on the second side 212 of the die 210 instead of using wire-bonds on the first side 211 of the die 210. The height of the microelectronic imager 200 is also less than with conventional imagers because the imager 200 can be mounted directly to a module or board without an interposer substrate. Therefore, the microelectronic imager 200 is expected to have a smaller footprint and a lower profile than conventional microelectronic imagers, which is particularly advantageous for picture cell phones, PDAs, or other applications where space is limited.

Figure 3:
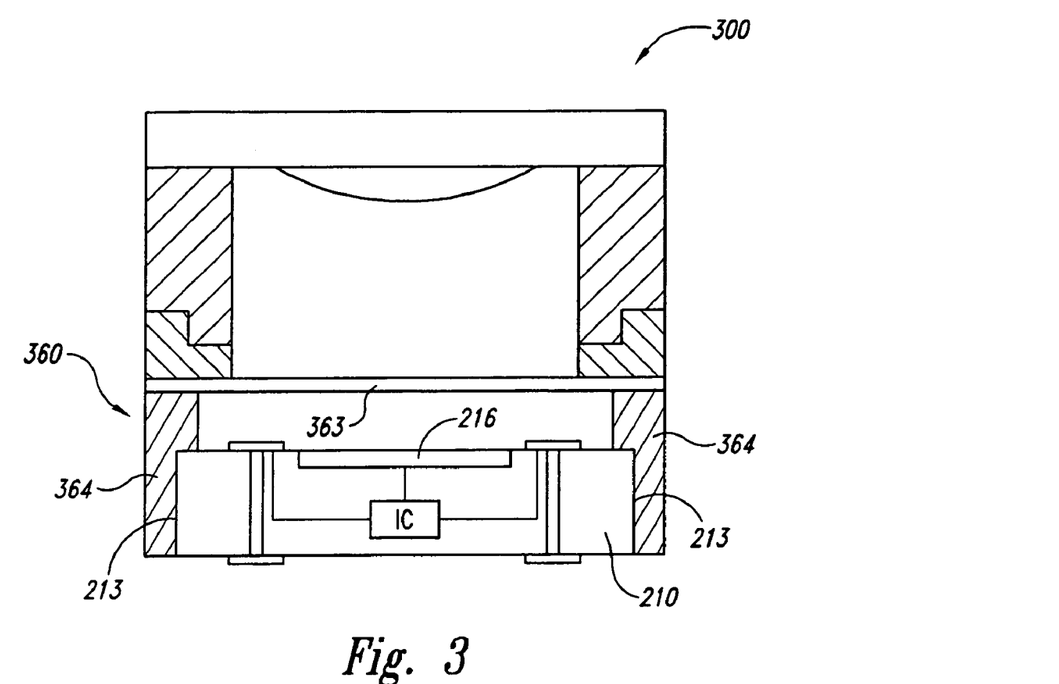
FIG. 3 is a schematic side cross-sectional view of a microelectronic imager in accordance with another embodiment of the invention.

FIG. 3 is a schematic side cross-sectional view of a microelectronic imager 300 in accordance with another embodiment of the invention. The microelectronic imager 300 can be generally similar to the microelectronic imager 200 shown in FIG. 2A; like reference numbers accordingly refer to like components in FIGS. 2A and 3. In this embodiment, the imager 300 has a cover unit 360 that includes a window 363 (e.g., a cover) and a side member 364. The side member 364 is attached to the window 363 before the cover unit 360 is attached to the die 210. The primary difference between the cover unit 360 shown in FIG. 3 and the cover unit 260 shown in FIG. 2A is that the window 363 is not formed integrally with the side member 364. The window 363 and side member 364 in this embodiment are accordingly separate components that can be made from the same material or different materials. For example, the window 363 can be made of glass, quartz, or other materials transmissive to a desired spectrum of radiation, and the side member 364 can be made of a different material. The side member 364 conforms to the end surfaces 213 of the die 210 to position the window 363 at a desired location relative to the image sensor 216.

Figure 4:
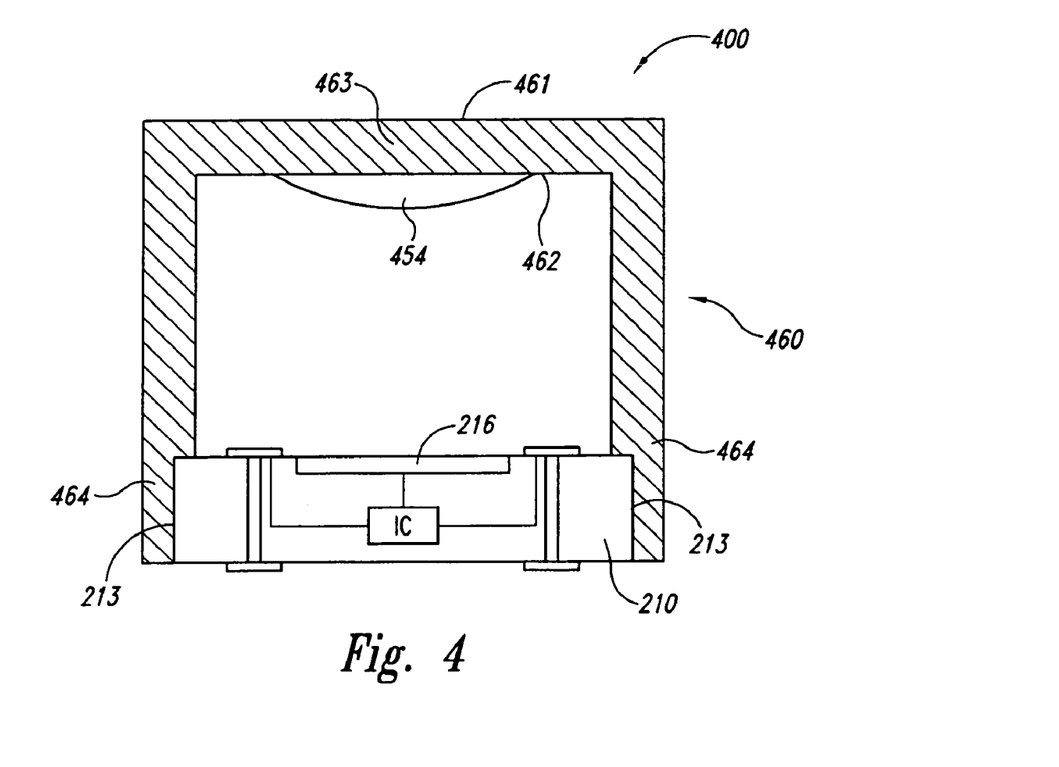
FIG. 4 is a schematic side cross-sectional view of a microelectronic imager in accordance with another embodiment of the invention.

FIG. 4 is a schematic side cross-sectional view of a microelectronic imager 400 in accordance with another embodiment of the invention. In one aspect of this embodiment, the microelectronic imager 400 can include a cover unit 460 that combines certain features of the cover unit 260, support member 240 and optic member 254 described above with reference to FIG. 2A to form an integrated cover/optics unit. The cover unit 460 includes a window 463 having a first side 461 facing generally away from the image sensor 216 and a second side 462 facing generally toward the image sensor 216. The cover unit 460 further includes a side member 464 with alignment features corresponding to end surfaces 213 of the die 210. The side member 464 can be attached to the die 210 as described above with reference to FIG. 2A. The cover unit 460 can also include an optic member 454 attached to or formed integrally with the window 463. The side member 464 can be configured to position the optic member 454 at a desired location relative to the image sensor 216. In one aspect of this embodiment, the optic member 454 is part of the single unitary component type cover unit 460 and can be formed of the same material as the cover unit 460. In other embodiments, the optic member 454 can be attached separately to the single unitary member cover unit 460 and can be made of other materials.

Figure 5:
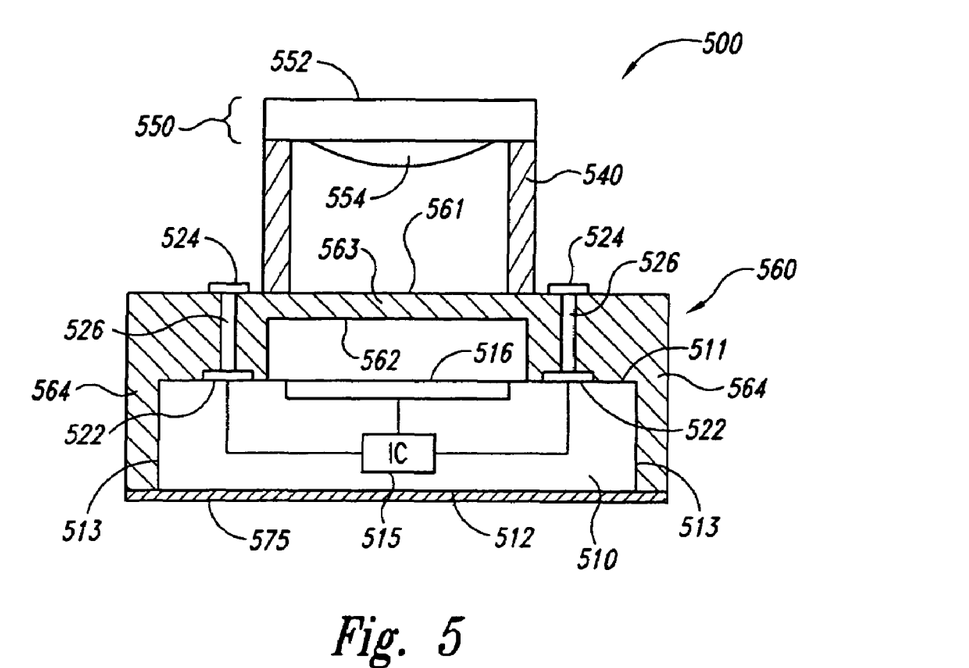
FIG. 5 is a schematic side cross-sectional view of a microelectronic imager in accordance with another embodiment of the invention.

FIG. 5 is a schematic side cross-sectional view of a microelectronic imager 500 in accordance with another embodiment of the invention. In one aspect of this embodiment, the microelectronic imager 500 can include a microelectronic die 510 generally similar to the microelectronic die described above with respect to FIG. 2. The die 510 includes a first side 511, a second side 512 opposite the first side 511, and a plurality of end surfaces 513 defining the perimeter of the die 510. The die 510 includes an integrated circuit 515 (shown schematically), an image sensor 516 operably coupled to the integrated circuit 515, and an array of terminals 522 (e.g., bond-pads) electrically coupled to the integrated circuit 515. The die 510 differs from the die 210 shown in FIG. 2 in that the die 510 does not have through-wafer interconnects extending from the bond-pads 522 to the second side 512 of the die 510.

The microelectronic imager 500 can further include a cover unit 560 having a window 563 with a first side 561 facing generally away from the image sensor 516 and a second side 562 facing generally toward the image sensor 516. The cover unit 560 can further include a side member 564. The side member 564 projects from the window 563 and is configured to conform to the end surfaces 513 defining the perimeter of the die 510. The side member 564 can be attached to the end surfaces 513 of the die 510 as described above with respect to FIG. 2. In a further aspect of this embodiment, an encapsulant 575 can be disposed on the second side 512 of the die 510 to protect the die 510 from contamination and possible damage during handling. The encapsulant 575 can be applied using processes and methods known to those of skill in the art.

The cover unit 560 can further include a plurality of interconnects 526 electrically coupled to corresponding bond-pads 522 and extending through the cover unit 560. The interconnects 526 are generally constructed through the cover unit 560 before the cover unit 560 is attached to the die 510, but it is conceivable that they could be formed afterwards. The interconnects 526 shown in FIG. 5 are in electrical contact with corresponding ball-pads 524 or other external contacts. The pads 524 provide external electrical contacts for the die 510 arranged in a front side array for solder balls (not shown) or other conductive elements.

In another aspect of the embodiment illustrated in FIG. 5, the microelectronic imager 500 can further include an optics unit 550 attached to the cover unit 560 and aligned with the image sensor 516. The optics unit 550 can include a substrate 552 and an optic member 554 on the substrate 552 to transmit at least the desired spectrum of radiation to the image sensor 516. The substrate 552 and optic member 554 are supported by a support member 540. The optic member 554 can be a lens for focusing the light, a pinhole for reducing higher order refractions, and/or other optical structures for performing other functions. In further embodiments, the microelectronic imager 500 may not include an optics unit 550 or the optics unit 550 can have a different configuration.

Figure 6:
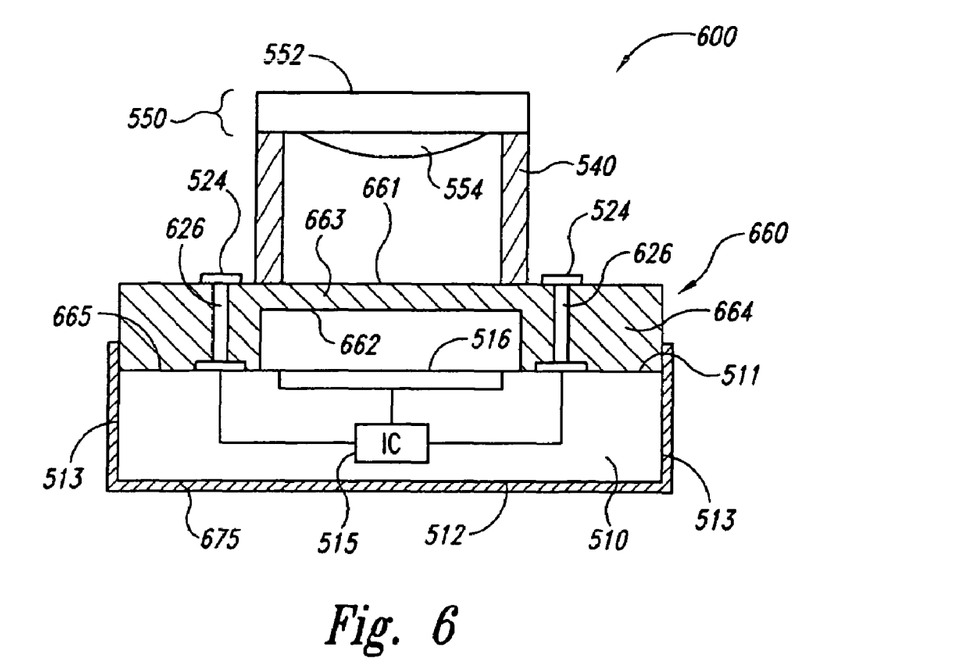
FIG. 6 is a schematic side cross-sectional view of a microelectronic imager in accordance with another embodiment of the invention.

FIG. 6 is a schematic side cross-sectional view of a microelectronic imager 600 in accordance with another embodiment of the invention. In one aspect of this embodiment, the microelectronic imager 600 can include a microelectronic die 510 generally similar to the microelectronic die described above with respect to FIG. 5; like reference numbers refer to like components in FIGS. 5 and 6. The microelectronic imager 600 can further include a cover unit 660 having a window 663 with a first side 661 facing generally away from the image sensor 516 and a second side 662 facing generally toward the image sensor 516. The cover unit 660 further includes a side member 664 having a sealing face 665 attached to the first side 511 of the die 510. The side member 664, however, differs from the previously described side members in FIGS. 2A-5 in that the side member 663 does not engage nor otherwise surrounds the end surfaces 513 of the die 510. In some embodiments, an adhesive (not shown) can be used to secure the cover unit 660 to the die 510. In a further aspect of this embodiment, an encapsulant 675 can be disposed on a second side 512 of the die 510 and over the end surfaces 513. The encapsulant 675 can also coat at least a portion of the cover unit 660. The encapsulant 675 seals and protects the die 510 and cover unit 660 from contamination and possible damage during handling. The encapsulant 675 can be applied using processes and methods known to those of skill in the art.

The cover unit 660 can also include a plurality of electrically conductive interconnects 626 electrically coupled to corresponding bond-pads 522 on the die 510 and extending through the cover unit 660. The interconnects 626 can be generally similar to the interconnects 526 described above with respect to FIG. 5. In another aspect of the embodiment illustrated in FIG. 6, the microelectronic imager 600 can further include the optics unit 550 attached to the cover unit 660 and aligned with the image sensor 516.

One feature of the illustrated embodiment is that side member 664 of the cover unit 660 does not have an interface element that is juxtaposed to the end surfaces 513 of the die 510. An advantage of this feature is that the footprint of the microelectronic imager 600 can be smaller than that of microelectronic imagers that include cover units with a side member surrounding the end surfaces 513 of the die 510. This is particularly advantageous for picture cell phones, PDAs, and other applications where space is limited.

Figure 7:
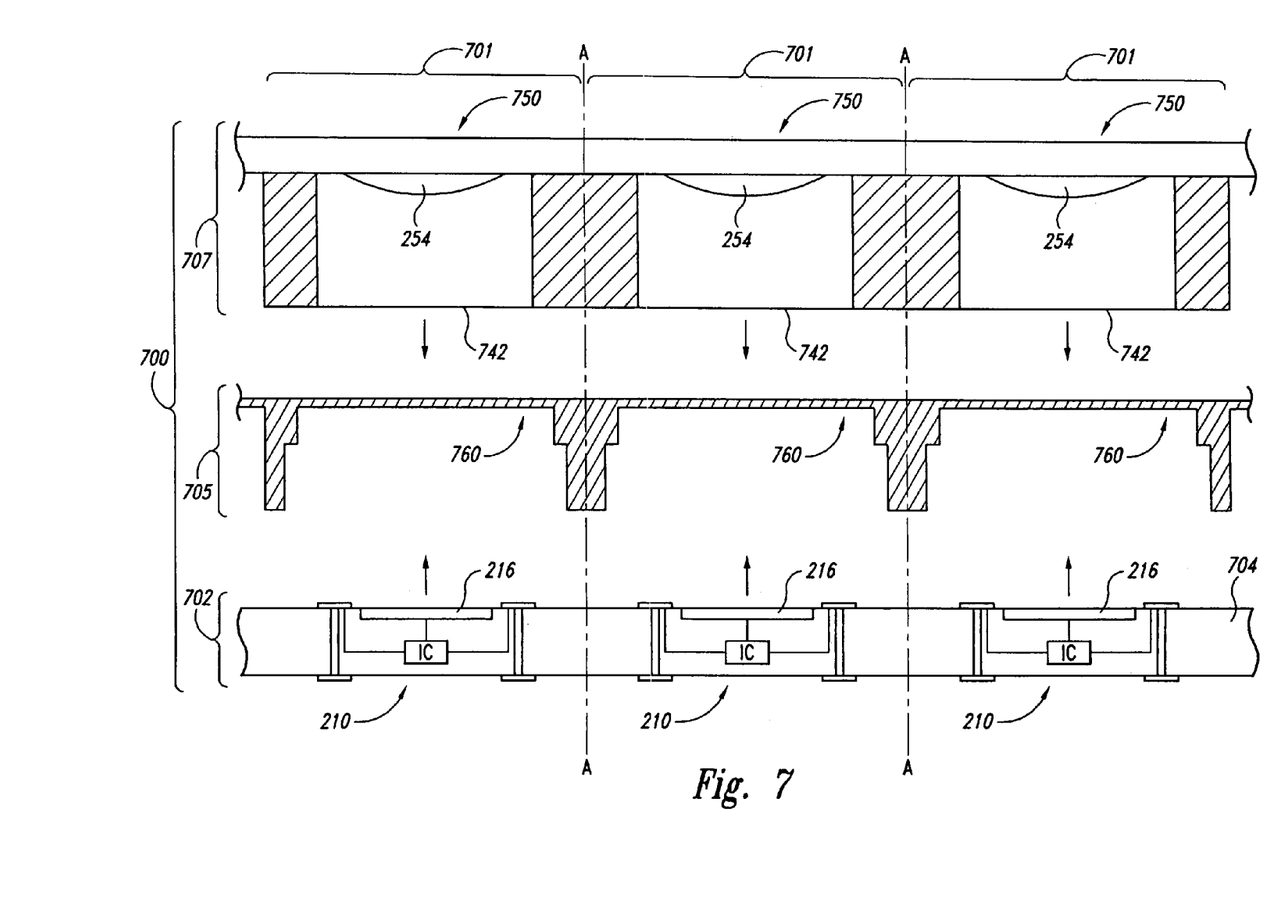
FIG. 7 is a schematic side cross-sectional view of a plurality of microelectronic imagers formed on a microfeature workpiece in accordance with another embodiment of the invention.

FIG. 7 is a schematic side cross-sectional view of an assembly 700 including a plurality of microelectronic imagers 701 that each have an imaging unit and an optics unit. The assembly 700 includes a microfeature workpiece 702 having a first substrate 704 and a plurality of microelectronic dies 210 formed in and/or on the first substrate 704. The individual microelectronic dies 210 can be generally similar to the dies described above with respect to FIGS. 2A and 3. The assembly 700 further includes a second substrate 705 having a plurality of cover units 760. The individual cover units 760 can be generally similar to the cover units described above with respect to FIGS. 2A and 2B. The individual cover units 760 can also include a first referencing element 732.

An optics workpiece 706 can include a third substrate 707 and a plurality of optics units 750. Individual optics units 750 can be generally similar to the optics units described above with respect to FIGS. 2A and 3. The individual optics units 750 can be attached to or otherwise include support members 742. As explained above, the support members 742 can have first and second referencing elements configured to be keyed together or otherwise seated with each other in a manner that aligns individual optic members 254 with corresponding image sensors 216.

The imagers 701 can be assembled by (a) attaching the second substrate 705 with the cover units 760 to the third substrate 707 with corresponding optics units 750, (b) cutting the substrate 702 along lines A-A to singulate the individual dies 210, (c) attaching individual dies 210 to corresponding cover units, and (d) cutting substrates 705 and 707 along lines A-A to separate individual imagers from each other. In a different embodiment, the individual imager components (e.g., optic units, cover units, and dies) can each be singulated and individual imagers can be assembled from the singulated components. In still other embodiments, the imagers can be assembled using various combinations of the above assembly steps.

Figure 8:
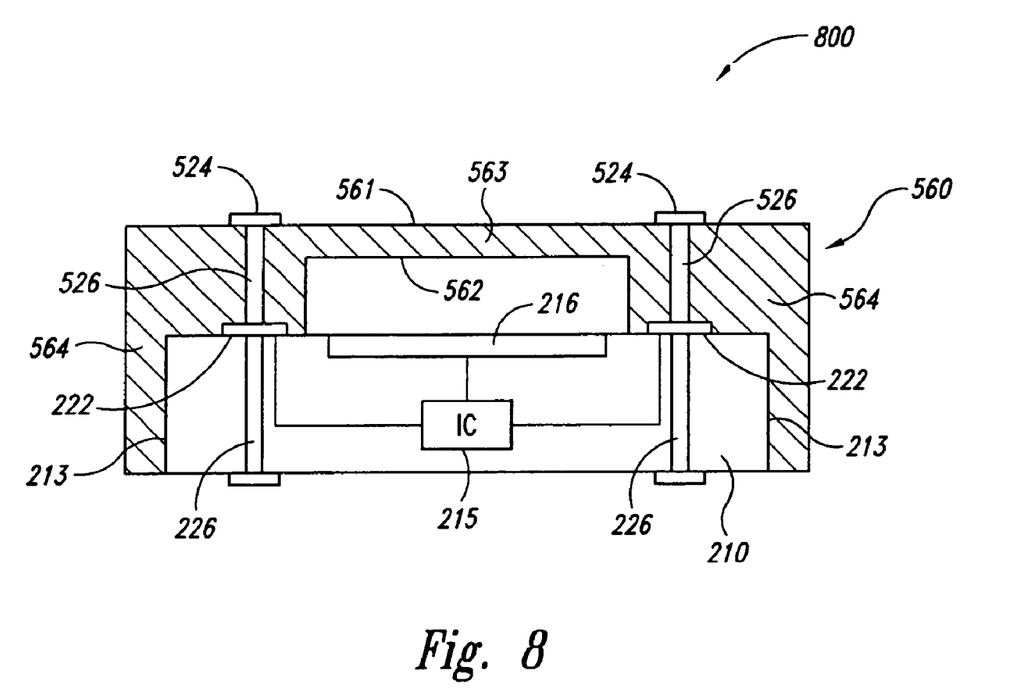
FIG. 8 is a schematic side cross-sectional view of a microelectronic imager in accordance with another embodiment of the invention.

From the foregoing, it will be appreciated that specific embodiments of the invention have been described herein for purposes of illustration, but that various modifications may be made without deviating from the spirit and scope of the invention. For example, the microelectronic imager may not include electrically conductive interconnects extending through the cover unit or, alternatively, may not include interconnects at all. Furthermore, various aspects of any of the foregoing embodiments can be combined in different combinations. FIG. 8, for example, illustrates a microelectronic imager 800 that is a combination of the imaging unit 200 from FIG. 2A and the cover unit 560 from FIG. 5. Accordingly, the invention is not limited except as by the appended claims.

I claim:

1. A microelectronic imaging unit, comprising:
a microelectronic die including an image sensor, an integrated circuit electrically coupled to the image sensor, and a plurality of terminals electrically coupled to the integrated circuit;
a cover unit over the image sensor, the cover unit being a single, unitary component having a window and an integral side member projecting from the window, the side member being attached to the die;
electrically conductive interconnects extending through the die, the interconnects being electrically coupled to corresponding terminals; and
an optics unit having a substrate and an optic member attached to the cover unit, wherein the optic member has a first side in contact with the substrate and a second side located between the first side and the microelectronic die.

2. The microelectronic imaging unit of claim 1 wherein:
the die includes a first side, a second side opposite the first side, and a perimeter between the first side and the second side; and
the side member is attached to at least a portion of the perimeter of the die.

3. The microelectronic imaging unit of claim 1 wherein:
the die includes a first side and a second side opposite the first side, the side member further includes a sealing face, the sealing face being attached to the first side of the die without any other portion of the side member contacting any other portion of the die.

4. The microelectronic imaging unit of claim 1 wherein:
the die includes a first side, a second side opposite the first side, and a perimeter between the first side and the second side; and
the cover unit encloses the first side of the die and at least a portion of the perimeter of the die, the cover unit being configured to seal the first side of the die and at least a portion of the perimeter of the die.

5. The microelectronic imaging unit of claim 1 wherein:
the die includes a first side, a second side opposite the first side, and a perimeter between the first side and the second side;
the cover unit encloses at least a portion of the first side and the perimeter of the die; and
the imaging unit further comprises an encapsulant disposed on the second side of the die.

6. The microelectronic imaging unit of claim 1 wherein:
the die includes a first side, a second side opposite the first side, and a perimeter between the first side and the second side;
the cover unit encloses at least a portion of the first side of the die without contacting or enclosing any portion of the perimeter of the die; and
the imaging unit further comprises an encapsulant disposed on at least a portion of (a) the second side of the die, (b) the perimeter of the die, and (c) the cover unit.

7. The microelectronic imaging unit of claim 1 wherein the optics unit is integral with the window and the side member.

8. The microelectronic imaging unit of claim 1 wherein:
the individual interconnects have a first end portion and a second end portion spaced apart from the first end portion;
corresponding terminals are coupled to the first end portions of each interconnect; and
the imaging unit further comprises a plurality of ball-pads coupled to corresponding second end portions of the interconnects.

9. The microelectronic imaging unit of claim 1 wherein:
the die includes a first side and a second side opposite the first side, wherein the terminals are at the first side of the die;
the individual interconnects have a first end portion coupled to corresponding terminals and a second end portion spaced apart from the first end portion; and
the imaging unit further comprises a plurality of ball-pads on the second side of the die coupled to corresponding second end portions of the interconnects.

10. The microelectronic imaging unit of claim 1 wherein:
the cover unit further includes a first side facing the image sensor and a second side opposite the first side;
the individual interconnects have a first end portion and a second end portion spaced apart from the first end portion;
corresponding terminals are coupled to the first end portions of each interconnect; and
the imaging unit further comprises a plurality of ball-pads on the second side of the cover unit coupled to corresponding second end portions of the interconnects.

11. The microelectronic imaging unit of claim 1 further comprising electrically conductive interconnects electrically coupled to corresponding terminals and extending through the cover unit.

12. The microelectronic imaging unit of claim 1 wherein the cover unit includes at least one of glass, quartz, or other materials transmissive to a desired spectrum of radiation.

13. A microelectronic imaging unit, comprising:
a microelectronic die including an image sensor, an integrated circuit electrically coupled to the image sensor, and a plurality of terminals electrically coupled to the integrated circuit;
a cover unit over the image sensor, the cover unit having a window and a side member projecting from the window, the side member being attached to the die;
electrically conductive interconnects electrically coupled to corresponding terminals and extending through the die; and
an optics unit having an optic member attached to the cover unit, wherein the optics unit is integral with the window and the optic member has a first side in contact with the window and a second side located between the first side and the microelectronic die.

14. The microelectronic imaging unit of claim 13 wherein:
the die includes a first side, a second side opposite the first side, and a perimeter between the first side and the second side; and the side member is attached to at least a portion of the perimeter of the die.

15. The microelectronic imaging unit of claim 13 wherein:
the die includes a first side, a second side opposite the first side, and a perimeter between the first side and the second side; and
the cover unit encloses the first side of the die and at least a portion of the perimeter of the die, the cover unit being configured to seal the first side of the die and at least a portion of the perimeter of the die.

16. The microelectronic imaging unit of claim 13 wherein:
the die includes a first side, a second side opposite the first side, and a perimeter between the first side and the second side; the cover unit encloses at least a portion of the first side and the perimeter of the die; and
the imaging unit further comprises an encapsulant disposed on the second side of the die.

17. The microelectronic imaging unit of claim 13 wherein:
the die includes a first side and a second side opposite the first side, wherein the terminals are at the first side of the die;
the individual interconnects have a first end portion coupled to corresponding terminals and a second end portion spaced apart from the first end portion; and
the imaging unit further comprises a plurality of ball-pads on the second side of the die coupled to corresponding second end portions of the interconnects.

18. The microelectronic imaging unit of claim 13 wherein:
the die includes a first side and a second side opposite the first side, wherein the terminals are at least proximate to the first side of the die;
the individual interconnects have a first end portion coupled to corresponding terminals and a second end portion spaced apart from the first end portion; and
the imaging unit further comprises a plurality of ball-pads on the second side of the die coupled to corresponding second end portions of the interconnects.

19. The microelectronic imaging unit of claim 13 further comprising electrically conductive interconnects electrically coupled to corresponding terminals and extending through the cover unit.

20. The microelectronic imaging unit of claim 13 wherein the window and the side member include at least one of glass, quartz, or other materials transmissive to a desired spectrum of radiation.

21. A microelectronic imaging unit, comprising:
a microelectronic die having a first side, a second side opposite the first side, and a perimeter having end surfaces;
an image sensor on the first side of the die;
an integrated circuit in the die and electrically coupled to the image sensor;
a plurality of bond-pads on the first side of the die and electrically coupled to the integrated circuit;
a cover unit over the image sensor, the cover unit being a single, unitary component having a window and a side member projecting from the window, and the side member being attached to the die;
electrically conductive interconnects electrically coupled to corresponding bond-pads and extending through the die; and
an optics unit having a substrate and an optic member attached to the cover unit, wherein the optic member has a first side in contact with the substrate and a second side located between the first side and the microelectronic die.

22. The microelectronic imaging unit of claim 21 wherein the side member is attached to at least a portion of the perimeter of the die.

23. The microelectronic imaging unit of claim 21 wherein the side member further includes a sealing face, the sealing face being attached to the first side of the die without any other portion of the side member contacting any other portion of the die.

24. The microelectronic imaging unit of claim 21 wherein the cover unit encloses the first side of the die and at least a portion of the perimeter of the die, the cover unit being configured to seal the first side of the die and at least a portion of the perimeter of the die.

25. The microelectronic imaging unit of claim 21 wherein:
the cover unit encloses at least a portion of the first side and the perimeter of the die; and
the imaging unit further comprises an encapsulant disposed on the second side of the die.

26. The microelectronic imaging unit of claim 21 wherein:
the cover unit encloses at least a portion of the first side of the die without contacting the perimeter of the die; and
the imaging unit further comprises an encapsulant disposed on at least a portion of (a) the second side of the die, (b) the perimeter of the die, and (c) the cover unit.

27. The microelectronic imaging unit of claim 21 wherein the optics unit is integral with the window and the side member.

28. The microelectronic imaging unit of claim 21 wherein:
the individual interconnects have a first end portion coupled to corresponding terminals and a second end portion spaced apart from the first end portion; and
the imaging unit further comprises a plurality of ball-pads coupled to corresponding second end portions of the interconnects.

29. The microelectronic imaging unit of claim 21 wherein:
the individual interconnects have a first end portion coupled to corresponding terminals and a second end portion spaced apart from the first end portion; and
the imaging unit further comprises a plurality of ball-pads on the second side of the die coupled to corresponding second end portions of the interconnects.

30. The microelectronic imaging unit of claim 21 wherein:
the cover unit further includes a first side facing the image sensor and a second side opposite the first side;
the individual interconnects have a first end portion coupled to corresponding terminals and a second end portion spaced apart from the first end portion; and
the imaging unit further comprises a plurality of ball-pads on the second side of the cover unit coupled to corresponding second end portions of the interconnects.

31. The microelectronic imaging unit of claim 21 further comprising electrically conductive interconnects electrically coupled to corresponding terminals and extending through the cover unit.

32. The microelectronic imaging unit of claim 21 wherein the cover unit includes at least one of glass, quartz, or other materials transmissive to a predetermined spectrum of radiation.

33. A plurality of microelectronic imagers, comprising:
a microfeature workpiece including a plurality of microelectronic dies, the individual dies having an image sensor, an integrated circuit electrically coupled to the image sensor, and a plurality of bond-pads electrically coupled to the integrated circuit;
a plurality of cover units over corresponding image sensors, the cover units being single, unitary components having a window and a side member integral with and projecting from the window, the individual side members being attached to corresponding individual dies;
electrically conductive interconnects extending through the individual dies and electrically coupled to corresponding terminals; and
a plurality of optics units, each corresponding to one of the plurality of cover units, each having an optic member attached to the corresponding cover unit, wherein the individual optics units are integral with the respective windows, each optic member having a first side in contact with the window and a second side located between the first side and the corresponding microelectronic die.

34. The microelectronic imagers of claim 33 wherein: the individual dies include a first side, a second side opposite the first side, and a perimeter between the first side and the second side; and
the individual side members are attached to at least a portion of the perimeter of the individual dies.

35. The microelectronic imagers of claim 33 wherein:
the individual dies includes a first side and a second side opposite the first side, the individual side members further include a sealing face attached to the first side of the individual die without any other portion of the individual cover units contacting any other portion of the individual dies.

36. The microelectronic imagers of claim 33 wherein:
the individual dies includes a first side, a second side opposite the first side, and a perimeter between the first side and the second side; and
the individual cover units enclose the first side of the individual dies and at least a portion of the perimeter of the individual dies, the individual cover units being configured to seal the first side and at least a portion of the perimeter of the individual dies.

37. A method of packaging a microelectronic imager, comprising:
providing a microelectronic die having an image sensor, an integrated circuit electrically coupled to the image sensor, and a plurality of terminals electrically coupled to the integrated circuit;
providing a cover unit having a window and a side member projecting from and integral with the window;
attaching the cover unit to the die over the image sensor;
forming a plurality of electrically conductive interconnects electrically coupled to corresponding terminals and extending through the die; and
attaching an optics unit having an optic member to the cover unit, wherein optics unit is integral with the window and the optic member is formed with a first side in contact with the window and a second side located between the first side and the microelectronic die.

38. The method of claim 37 wherein:
the die includes a first side, a second side opposite the first side, and a perimeter between the first side and the second side; and attaching the cover unit to the die includes attaching the side member to at least a portion of the perimeter of the die.

39. The method of claim 37 wherein:
the die includes a first side and a second side opposite the first side;
the side member further includes a sealing face; and
attaching the cover unit to the die includes attaching the sealing face to the first side of the die without any other portion of the side member contacting any other portion of the die.

40. The method of claim 37 wherein:
the die includes a first side, a second side opposite the first side, and a perimeter between the first side and the second side; and
attaching the cover unit to the die includes enclosing and sealing the first side of the die and at least a portion of the perimeter of the die with the cover unit.

41. The method of claim 37 wherein:
the die includes a first side, a second side opposite the first side, and a perimeter between the first side and the second side;
attaching the cover unit to the die includes enclosing at least a portion of the first side and the perimeter of the die with the cover unit; and
the method further comprises disposing an encapsulant on the second side of the die.

42. The method of claim 37 wherein:
the die includes a first side, a second side opposite the first side, and a perimeter between the first side and the second side;
attaching the cover unit to the die includes enclosing at least a portion of the first side of the die with the cover unit without contacting or enclosing any portion of the perimeter of the die; and
the method further comprises disposing an encapsulant on at least a portion of (a) the second side of the die, (b) the perimeter of the die, and (c) the cover unit.

43. The method of claim 37 wherein providing a cover unit further comprises providing a single unitary member cover unit.

44. The method of claim 37 wherein:
the individual electrically conductive interconnects have a first end portion and a second end portion spaced apart from the first end portion;
the method further comprises coupling corresponding terminals to the first end portions of each interconnect; and
the imaging unit further comprises a plurality of ball-pads, wherein corresponding ball-pads are coupled to the second end portions of each interconnect.

45. A method of packaging a plurality of microelectronic imagers, comprising:
providing a microfeature workpiece including a plurality of microelectronic dies, the individual dies having an image sensor, an integrated circuit electrically coupled to the image sensor, and a plurality of bond-pads electrically coupled to the integrated circuit;
providing a plurality of cover units, the cover units being single, unitary components having a window and a side member;

attaching individual cover units to individual dies over corresponding image sensors;

forming a plurality of electrically conductive interconnects extending through individual dies and/or electrically coupled to corresponding bond-pads; and attaching a plurality of optics units having a substrate and an optic member to corresponding individual cover units, wherein each of the optic members has a first side in contact with the individual substrate and a second side located between the first side and the corresponding microelectronic die.

46. The method of claim 45 wherein:

the individual dies includes a first side, a second side opposite the first side, and a perimeter between the first side and the second side; and attaching individual cover units to individual dies includes attaching individual side members to corresponding perimeters of the individual dies.

47. The method of claim 45 wherein:

the individual dies includes a first side, a second side opposite the first side, and a perimeter between the first side and the second side; and attaching individual cover units to individual die includes enclosing and sealing the first side of the individual dies and at least a portion of the perimeter of the individual dies with the individual cover units.

* * * * *

UNITED STATES PATENT AND TRADEMARK OFFICE
CERTIFICATE OF CORRECTION

PATENT NO. : 7,253,397 B2 Page 1 of 1
APPLICATION NO. : 10/785466
DATED : August 7, 2007
INVENTOR(S) : Kirby It is certified that error appears in the above-identified patent and that said Letters Patent is hereby corrected as shown below:

In column 15, line 4, in Claim 45, delete "and/or" and insert -- and --, therefor.

Signed and Sealed this

First Day of January, 2008

JON W. DUDAS
*Director of the United States Patent and Trademark Office*